United States Patent [19]

Zumsteg et al.

[11] 4,245,173

[45] Jan. 13, 1981

[54] BEVELED, COUPLED MODE PIEZO-ELECTRIC RESONATOR

[75] Inventors: Alphonse E. Zumsteg, Solothurn; Pavel Suda, Bienne, both of Switzerland

[73] Assignee: Societe Suisse pour l'Industrie Horlogere Management Services S.A., Bienne, Switzerland

[21] Appl. No.: 24,300

[22] Filed: Mar. 27, 1979

[51] Int. Cl.³ ............................. H01L 41/08; H01L 41/18
[52] U.S. Cl. ........................................ 310/361; 310/367
[58] Field of Search .................. 310/360, 361, 367, 368, 310/320

[56] References Cited

U.S. PATENT DOCUMENTS

| | | | |
|---|---|---|---|
| 2,485,722 | 10/1949 | Erwin | 310/360 |
| 3,311,854 | 3/1967 | Mason | 310/361 X |
| 3,497,732 | 2/1970 | Royer | 310/368 X |
| 4,035,674 | 7/1977 | Oguchi et al. | 310/361 X |
| 4,071,797 | 1/1978 | Zumsteg et al. | 310/361 |

Primary Examiner—Mark O. Budd
Attorney, Agent, or Firm—Griffin, Branigan & Butler

[57] ABSTRACT

A yzw 35°0' thickness shear crystal bar is provided with bevels cut in its longest narrow surfaces (b, c) proximate the ends in order to obtain energy trapping of the coupled mode vibrations which may arrive at said ends and thus permit shortening of the bar for a given quality factor.

17 Claims, 4 Drawing Figures

BEVELED, COUPLED MODE PIEZO-ELECTRIC RESONATOR

BACKGROUND OF THE INVENTION

The efforts directed to the development of piezo-electric resonators continue to take on greater importance as more and more applications are found for such resonators. Among the important objects of present day efforts is to be included the continued reduction in dimensions of the resonators and at the same time the maintaining of a high quality factor or even increasing the known quality factors obtainable with the various forms presently existing. For resonators having a frequency much above 1 MHz a preferred or at least frequently used type when executed in quartz is the so-called AT cut. This, when properly electroded, will vibrate in the thickness shear mode. Over a substantial period of time AT quartz crystals were cut in the form of lenses or disks and this form tended to occupy considerable space. Among the various efforts to reduce this occupancy of space may be cited the researches which led to a grant of U.S. Pat. No. 4,124,809. This patent concerns a thickness shear AT cut resonator in which the disk is replaced by a rectangular bar and the bar is excited by means of electrodes placed so as to result in a so-called energy trapping mode of operation.

Continued research along the same line led to the invention presently protected by U.S. Pat. No. 4,071,797. This latter follows the same line of thinking as led to the previously mentioned patent, but contrary to most current teaching advocated use of a phenomenon previously considered to be preferably avoided. This phenomenon was that of the coupling of vibration modes which is bound to occur in a vibrating body bounded in its dimensions. Previously known AT type crystals had in all cases been subject to this coupling factor in which owing to the conservation of momentum in a bounded plate, shear vibrations are coupled to flexure vibrations running in a direction which is the same as that of the particle displacement of the thickness shear wave. Through suitable proportioning of the bar it is possible, to some extent at least, to suppress the effect produced by coupling. Prior teachings generally showed that the proportions required were such as to preclude the possibility of obtaining a high quality factor resonator within the dimensional limits desired. Nevertheless, by applying the teachings of U.S. Pat. No. 4,071,797 it was found possible to improve temperature performance, quality factor and at the same time reduce the dimensions to a hitherto unknown degree for this type of resonator crystal.

The present invention starts off from the teaching as set forth in U.S. Pat. No. 4,071,797.

Although the specific examples set forth hereinafter have been limited to quartz crystals of the AT cut it will be clear from the teaching given that there is no real necessity to limit the invention to the specifics as shown, since the physical phenomena set forth may be found readily applicable to any system vibrating in the manner as hereinafter explained and may be expected to provide reduced dimensions whilst maintaining the desirable quality factor.

SUMMARY OF THE INVENTION

As in the case of U.S. Pat. No. 4,071,797 the invention starts off with a piezo-electric resonator in rectangular bar form cut from a suitable material such as quartz and provided with electrodes so as to vibrate when properly excited in a mode which is the resultant of coupling of a thickness shear mode and a flexural mode wherein flexural vibrations terminate on the longest narrow surfaces. In particular the invention now proposed provides bevels cut in the longest narrow surfaces proximate the ends of the bar. The result of such bevels is to achieve energy trapping of the resultant coupled mode by frequency mismatch of flexural vibrations proximate the end of the bar from such flexural vibrations occurring proximate the centre thereof.

DETAILED DESCRIPTION OF THE INVENTION

Figure 1:
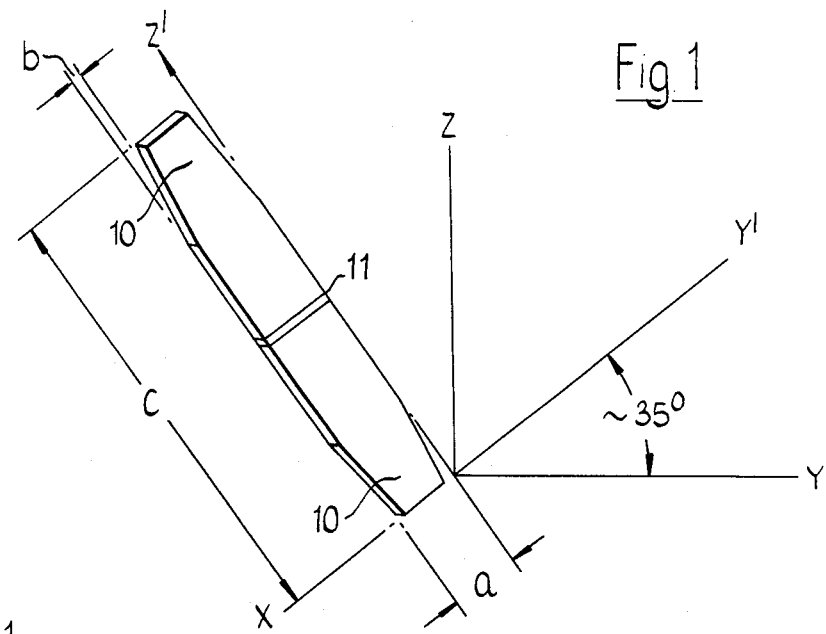
FIG. 1 is a representation showing a specific type of resonator notably a quartz At-cut bevelled in accordance with the invention.

The specific example chosen to illustrate the invention in a yzw 35°0′ bar which as previously shown in U.S. Pat. No. 4,071,797 when suitably electroded so as to provoke energy trapped thickness shear vibrations across the X-axis (dimension a) will at the same time through a coupling effect provide flexure vibrations along the same axis. As pointed out these vibrations owing to their orientation and the energy trapping hitherto employed do not seriously interfere with mounting the resonator at the ends, in other words very little energy is transmitted to the ends of the bar at which the supports may normally be found. Accordingly, such a bar in practice has been found to have a relatively high quality factor of the order of 500,000. Since the electroding is confined to a central region of the bar both thickness shear vibrations and coupled flexure vibrations which might otherwise be transmitted towards the ends of the bar are damped in an exponential fashion. Nevertheless, this arrangement requires a certain minimum length dimension in order that exponential damping will be effective. If such is not the case the quality factor will be rapidly lowered. In an effort to reduce this length dimension as represented by c in FIG. 1 it is now proposed to provide each end of the bar 1 as shown in FIG. 1 with bevels 10. These bevels are cut on the longest narrow edge of the bar and may be dimensioned in accordance with various criteria for which a general rule has not yet been found, but for which experiments have resulted in useful results as will be shown hereinafter.

Figure 1A:
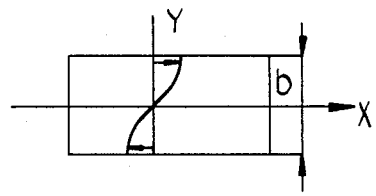
FIG. 1a shows the thickness shear wave (C mode) in an AT-cut rectangular bar.
Figure 1B:
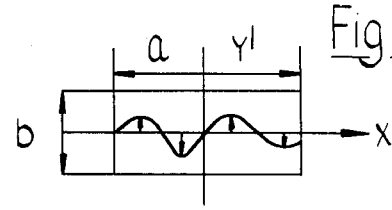
FIG. 1b shows the flexural wave coupled to the C mode thickness shear in the same AT-cut rectangular bar.

As shown in the drawing suppose a section 11 of bar 1 should be cut from the bar as shown in FIGS. 1a and 1b. FIG. 1a shows the thickness shear wave propagating in the Y′-direction with particle displacement in the X-direction as shown by the arrows. The frequency of such C mode, if it were pure, is dependent only upon the thickness and is given by $$f_{TS} = (1/2b)\sqrt{c_{66}'/\rho}$$

wherein b = total thickness $c_{66}'$ = rotated elastic constant
$\rho$ = density of quartz coupled to these thickness shear vibrations will be the usual flexure vibrations propagating in the X-direction with particle displacement in the Y'-direction as indicated by the arrows in FIG. 1b. The frequency of the flexural mode if pure is given by $$f_{fl} = k(b/a^2)$$

wherein k is a constant and
a is the X dimension of the bar.

Suppose now that a similar section were cut from one of the bevelled ends it is clear that such a section would have the same thickness b and a length dimension less than a.

Thus it will be understood that as this length (a) diminishes the flexure frequency of such a section will be increased.

If we now consider once again bar 1 it will be clear that the tapered portions will have a coupled flexure frequency higher than that of the central section. This mismatch of frequency will then result in a more rapid damping of flexure vibrations and owing to the strong coupling resultant vibrations of the coupled mode which would otherwise tend to reach the end of the bar notwithstanding the normal exponential damping. In other words the phenomenon which has just been described is equivalent to an energy trapping of the flexural and resultant coupled mode vibrations. The fact of this energy trapping as now may be more readily appreciated enables a reduction in the overall length c of bar 1 while nevertheless permitting the maintenance of satisfactorily high quality factor. It will not be pretended that the use of bevels in conjunction with quartz resonator bars is of itself new, see for instance U.S. Pat. No. 3,497,732 or U.S. Pat. No. 2,261,791. In the first of these the theory is not really set forth as to how the results are obtained. Nevertheless it is noted that the discussion concerns a DT cut crystal, thus one which is adapted to vibrate in surface shear. The manner in which the bevels are cut in this particular quartz suggest that the phenomenon which may be found therein is similar to that of energy trapping in respect of the thickness shear vibration. In the present instance, however, we are concerned not merely with thickness shear vibrations, as have already been described, but rather the additional phenomenon brought about through the coupled flexure vibrations. Methods of trapping these and thereby improving quality factor whilst reducing dimensions have been hitherto unknown.

In the U.S. Pat. No. 2,261,791 the inventor discusses the problems associated with thickness shear crystals and the various ways and means to reduce the effects of spurious vibrations, particularly those which may arise from coupling. The solution which he proposes to this problem when considered in the light of present day knowledge would again appear to be nothing more than energy trapping applied to the thickness shear vibrations and it will be noted specifically that the bevels are cut in the thickness dimension (see also U.S. Pat. No. 4,124,809). Neither of these various hitherto proposed solutions has suggested in a coupled mode type of crystal an energy trapping arrangement specifically adapted to trap flexure vibrations arising from coupling with the thickness shear vibrations. Although the teaching set forth in U.S. Pat. No. 4,071,797 already went a substantial distance in reducing dimensions whilst improving the quality factor the present invention goes still one step further and enables a further reduction by applying energy trapping to the flexure vibrations which may propagate out to the ends of the bar notwithstanding the exponential damping brought about by energy trapping already applied in the case of the thickness shear vibrations.

Figure 2:
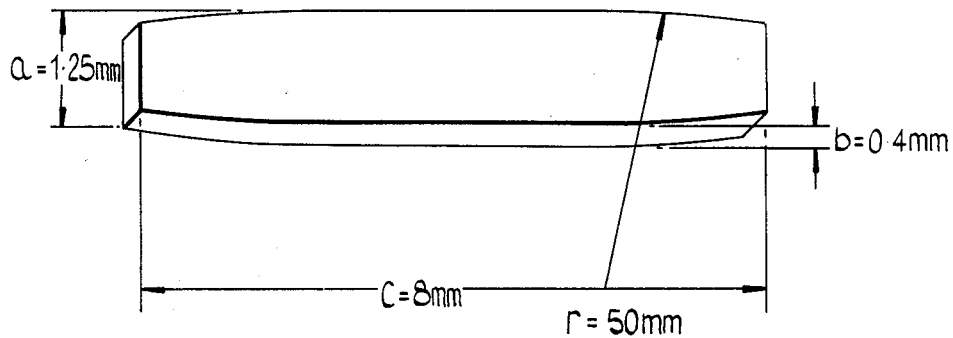
FIG. 2 shows the specific dimensions found for a particular example in such a resonator bar.

Various experiments have been carried out and one specific example is set forth particularly as shown in FIG. 2. Herein we are concerned with a yzw 35°0' quartz bar having dimensions as shown, notably c = 8 mm, a = 1.25 mm and b = 0.4 mm. The bevels as shown are cut with rounded surfaces to a radius of 50 mm and are placed so that the angle of such bevels with the longitudinal axis of the crystal will be between 3.10° and 3.15° to the longitudinal axis of the bar. The frequency of such a bar as determined by the thickness b will be approximately 4.19 MHz, a frequency which for instance may be useful in respect of resonators employed with timekeeping instruments. The electroding which is not shown may be conventionally arranged as set forth in our U.S. Pat. No. 4,071,797 and will result in the coupled mode of vibration as set forth in that patent wherein the vibrations terminate along the longest narrow edge of the crystal. Initial experiments made in accordance with the teachings U.S. Pat. No. 4,071,797 were with unbevelled crystals and provided for a length of 10 mm with the other dimensions unchanged from those shown in FIG. 2 herein. Results of tests performed on the earlier crystal indicated a Q of $\approx 500{,}000$, a resistance of $\approx 50$ Ohms and a dynamic capacity of $\approx 1.6 \cdot 10^{-15}$F for an electrode length of 3 mm. Upon applying the bevel as shown in FIG. 2 herein it was found possible to reduce the length c to 8 mm whereupon the quality factor remained at 500'000 and the resistance likewise remained at 50 Ohms. When, however, it was attempted to reduce the length of the crystal without providing the bevel therein the quality factor Q was found to fall below 100'000 and the resistance rose to 210 Ohms. It is not fully known what limits may be finally achieved, it being noted that when the dimension c was reduced to 7 mm the resistance rose to 65 Ohms while the quality factor dropped to approximately 380'000. This latter might still be acceptable for many applications.

In keeping with the theory as to the reason for which providing of bevels in the manner set forth enables the results to be achieved it may be expected that different bevel angles would be useful in conjunction with different frequencies and thus different dimensions otherwise applicable to crystals of this general type. Experiments so far carried out indicate that in general such bevels would be limited to angles between 1° and 4° in accordance with the other specific dimensions of the bar. In the present case we have found an optimum bevel for the particular AT quartz bar cut to vibrate at 4.19 MHz and adapted to vibrate in a thickness shear mode heavily coupled with a flexure mode transversal to the length of the bar. It would nevertheless appear that in principle the arrangement which we have proposed and have set forth in general would be applicable to various cuts of quartz crystals (in particular the BT cut yzw −49°8') and in fact could be applied to piezo-electric vibrators formed from other materials to the extent that such could be induced to vibrate in the coupled mode as set forth herein. Thus, although in our optimized bar the radius of coverture of the bevels may have a value from 6 to 7 times the length of the bar it might well be possible in a different arrangement to vary this radius and in fact to use straight cut bevels. In any event experiments with the bar as presently set forth have proved highly positive.

What we claim is:

1. A piezo-electric resonator in the form of a generally rectangular bar cut from a suitable material and provided with electrodes so as to vibrate when properly excited in a mode which is the resultant of coupling of a thickness shear mode and a flexural mode with flexural vibrations terminating on the longest narrow surfaces (b, c) and wherein bevels are cut in said longest narrow surfaces proximate the ends of the bar thereby to achieve energy trapping of said resultant coupled mode by frequency mismatch of flexural vibrations proximate the ends of the bar from those proximate the centre thereof.

2. A piezo-electric resonator as set forth in claim 1 wherein said bar comprises a quartz crystal in a rotated Y cut of approximately 35°0′ and having its greatest dimension along Z′ (yzw $\approx$ 35°0′).

3. A piezo-electric resonator as set forth in claim 1 wherein said bar comprises a quartz crystal in a rotated Y cut of approximately −49°8′ and having its greatest dimension along Z′ (yzw $\approx$ −49°8′).

4. A piezo-electric resonator as set forth in claim 2 wherein said bevels are cut in the Y′Z′ surfaces.

5. A piezo-electric resonator as set forth in claim 3 wherein said bevels are cut in the Y′Z′ surfaces.

6. A piezo-electric resonator as set forth in claim 4 wherein symmetric bevels are cut in both Y′Z′ surfaces and at both ends of the bar.

7. A piezo-electric resonator as set forth in claim 5 wherein symmetric bevels are cut in both Y′Z′ surfaces and at both ends of the bar.

8. A piezo-electric resonator as set forth in claim 6 wherein said bevels are cut at an angle of 1°–4° to the longitudinal axis of the bar.

9. A piezo-electric resonator as set forth in claim 7 wherein said bevels are cut at an angle of 1°–4° to the longitudinal axis of the bar.

10. A piezo-electric resonator as set forth in claim 8 wherein said angle is 3.10°–3.15° for a width-thickness ratio of $\approx$ 3.12 for a 4.19 MHz crystal.

11. A piezo-electric resonator as set forth in claim 9 wherein said angle is 3.10°–3.15° for a width-thickness ratio of $\approx$ 3.12 for a 4.19 MHz crystal.

12. A piezo-electric resonator as set forth in claim 6 wherein the intersection of said bevels with the XZ′ surface of the crystal forms a curve.

13. A piezo-electric resonator as set forth in claim 7 wherein the intersection of said bevels with the XZ′ surface of the crystal forms a curve.

14. A piezo-electric resonator as set forth in claim 12 wherein the radius of curvature is constant.

15. A piezo-electric resonator as set forth in claim 13 wherein the radius of curvature is constant.

16. A piezo-electric resonator as set forth in claim 14 wherein the radius of curvature has a value from 6–7 times the length of the bar.

17. A piezo-electric resonator as set forth in claim 15 wherein the radius of curvature has a value from 6–7 times the length of the bar.

* * * * *